(12) United States Patent
Mizuo et al.

(10) Patent No.: US 10,269,533 B2
(45) Date of Patent: Apr. 23, 2019

(54) ANTI-CONTAMINATION TRAP, AND VACUUM APPLICATION DEVICE

(71) Applicant: Hitachi High-Technologies Corporation, Minato-ku, Tokyo (JP)

(72) Inventors: Takashi Mizuo, Tokyo (JP); Yusuke Tamba, Tokyo (JP); Haruhiko Hatano, Tokyo (JP); Kazutaka Nimura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 499 days.

(21) Appl. No.: 14/911,960

(22) PCT Filed: Sep. 18, 2014

(86) PCT No.: PCT/JP2014/074615
§ 371 (c)(1),
(2) Date: Feb. 12, 2016

(87) PCT Pub. No.: WO2015/041267
PCT Pub. Date: Mar. 26, 2015

(65) Prior Publication Data
US 2016/0203940 A1    Jul. 14, 2016

(30) Foreign Application Priority Data

Sep. 20, 2013  (JP) ................. 2013-194807
Feb. 14, 2014  (JP) ................. 2014-026042

(51) Int. Cl.
*B01D 8/00*    (2006.01)
*F25B 19/00*   (2006.01)
(Continued)

(52) U.S. Cl.
CPC ............ *H01J 37/18* (2013.01); *F25B 19/005* (2013.01); *F25B 45/00* (2013.01); *H01J 37/16* (2013.01);
(Continued)

(58) Field of Classification Search
CPC . F25B 19/00; F25B 19/005; H01J 2237/2001; H01J 2237/2002; H01J 2237/2003; H01J 2237/2004; B01D 8/00
See application file for complete search history.

(56) References Cited

U.S. PATENT DOCUMENTS 3,736,937 A * 6/1973 Basiulis ................. A61B 18/02
                                                606/116
4,179,605 A * 12/1979 Watanabe ............... H01J 37/20
                                                250/311
(Continued)

FOREIGN PATENT DOCUMENTS

JP      54-3594 A     1/1979
JP      4-363853 A    12/1992
(Continued)

OTHER PUBLICATIONS

International Search Report (PCT/ISA/210) issued in PCT Application No. PCT/JP2014/074615 dated Nov. 11, 2014 with English-language translation (four (4) pages).
(Continued)

*Primary Examiner* — Frantz F Jules
*Assistant Examiner* — Erik Mendoza-Wilkenfel
(74) *Attorney, Agent, or Firm* — Crowell & Moring LLP

(57) ABSTRACT

In conventional structures, a space between a dual cooling tank is vacuum insulated, and a cooling part is cooled via a highly thermally conductive material connected to an inner container. Such structures are affected by heat infiltrating into the highly thermally conductive material and the cooling part. For instance, in cases when liquid nitrogen is used as a coolant, it takes approximately 30 minutes for the temperature to reach −120° C. Even in cases when a significant amount of time has been spent, the temperature only reaches approximately −150° C., and thus falls significantly short of the temperature of liquid nitrogen, namely (Continued)

−196° C. Accordingly, an anti-contamination trap and a vacuum application device according to the present invention are provided with a structure in which a device-internal cooling part in the vacuum application device is cooled, and are characterized by being provided with: a cooling tank filled with a coolant for cooling a cooling part; and a cooling pipe extending from the cooling tank to the vicinity of the cooling part. The anti-contamination trap and the vacuum application device are further characterized in that: the coolant is supplied to an end of the cooling part; and a tube for releasing air bubbles inside the cooling pipe is inserted so as to extend to the cooling part.

23 Claims, 12 Drawing Sheets

(51) Int. Cl.
*H01J 37/18* (2006.01)
*F25B 45/00* (2006.01)
*H01J 37/16* (2006.01)
*H01J 37/20* (2006.01)

(52) U.S. Cl.
CPC ......... *H01J 37/20* (2013.01); *H01J 2237/002* (2013.01); *H01J 2237/022* (2013.01); *H01J 2237/028* (2013.01); *H01J 2237/182* (2013.01); *H01J 2237/2001* (2013.01); *H01J 2237/2002* (2013.01)

(56) References Cited

U.S. PATENT DOCUMENTS

| | | | | | |
|---|---|---|---|---|---|
| 4,766,313 | A | * | 8/1988 | Homma | H01J 37/252 |
| | | | | | 250/289 |
| 4,833,330 | A | * | 5/1989 | Swann | H01J 37/02 |
| | | | | | 250/442.11 |
| 5,735,129 | A | * | 4/1998 | Ienaga | F25D 3/10 |
| | | | | | 250/443.1 |
| 6,046,457 | A | * | 4/2000 | Bohnenkamp | H01J 37/02 |
| | | | | | 250/397 |
| 2007/0040128 | A1 | | 2/2007 | Yamamoto et al. | |
| 2009/0224788 | A1 | * | 9/2009 | Sasajima | G01R 31/2891 |
| | | | | | 324/754.21 |
| 2012/0112064 | A1 | | 5/2012 | Nagakubo et al. | |

FOREIGN PATENT DOCUMENTS

| | | |
|---|---|---|
| JP | 9-120789 A | 5/1997 |
| JP | 2000-46452 A | 2/2000 |
| JP | 2000-133188 A | 5/2000 |
| JP | 2000-277045 A | 10/2000 |
| JP | 2007-53048 A | 3/2007 |
| JP | 2007-80698 A | 3/2007 |
| JP | 2009-245907 A | 10/2009 |
| JP | 2010-257617 A | 11/2010 |

OTHER PUBLICATIONS

Japanese-language Written Opinion (PCT/ISA/237) issued in PCT Application No. PCT/JP2014/074615 dated Nov. 11, 2014 (four (4) pages).

* cited by examiner

ANTI-CONTAMINATION TRAP, AND VACUUM APPLICATION DEVICE

TECHNICAL FIELD

The present invention relates to a vacuum application device such as a charged particle beam device and a freeze drying device.

BACKGROUND ART

In a charged particle beam device such as an electron microscope and a focused ion beam (FIB) processing device as well as in a freeze drying device, processing and observing of a sample containing moisture, a material susceptible to damage caused by irradiation with an electron beam, and the like are enabled by processing and observing the sample while freezing and cooling, whereby it has been a method widely used in fields such as of biomaterials and organic materials.

In the above-described method, however, since the sample is under a very low temperature, there is a problem of contamination in which carbon or the like within a vacuum device is adsorbed by the sample, and the sample becomes unclean. Thus, it is necessary to prevent the contamination of the sample by providing a cooling part, which has a temperature lower than that of the sample, inside the vacuum device.

One of related arts is disclosed in Japanese Patent Application Laid-Open No. 2010-257617 (PTL 1). For example, it is disclosed in Abstract that "a sample holder for efficiently performing the processing or observation of a sample by means of charged particles while cooling. Particularly, disclosed is a sample holder whereby the processing or observation of a material which may be affected by the influence of heat damage can be performed in a state in which the material is cooled, and furthermore, the influence due to a sample processing method using charged particles can be reduced by cooling. The sample holder is provided with a sample stage capable of fixing a sample piece extracted from a sample by ion beam irradiation, and a rotation mechanism for rotating the sample stage in a desired direction, which can be attached to an ion beam device and a transmission electron microscope device, and which has a movable heat transfer material for thermally connecting the sample stage and a cooling source, and an isolation material for thermally isolating the sample stage and the heat transfer material from the outside. According to the sample holder, the processing or observation of a sample by means of charged particle beams can be performed while efficiently cooling."

Another related art is disclosed in Japanese Patent Application Laid-Open No. 2000-277045 (PTL 2). For example, it is disclosed in Abstract that "PROBLEM TO BE SOLVED: To simplify the structure of a cryostage for observing sample freezing, and to attain the miniaturization thereof by arranging a cooling member near a sample so that a part of any one of a sample table, a sample holder and a sample stage contacts with the cooling member arranged between an objective lens and the sample. SOLUTION: In order to reduce the gas molecule near a sample surface while adsorbing the residual gas molecule and prevent the sample pollution, a cold cooling plate 16 (anti-contamination trap) is arranged between a lower part of an objective lens 8 and a sample 9. A fitting 21 as a structural member of a stage 20 and having heat conductivity in relation to the sample 9 is made to contact with the cooling plate 16 so as to cool the sample 9 placed on a sample table 19. A temperature sensor such as a thermo-couple 22 and a heating heater 23 are arranged in a heat conductive passage, and the heating heater 23 is controlled on the basis of the temperature information from the thermo-couple so as to control the temperature of the sample 9."

Still another related art is disclosed in Japanese Patent Application Laid-Open No. 2007-53048 (PTL 3). For example, it is disclosed in Abstract that "PROBLEM TO BE SOLVED: To provide a processing device using a focusing charged particle beam which can cool a test piece rapidly and can improve processing precision by reducing thermal drift. SOLUTION: A test piece which is observed and processed by the focusing charged particle beam is made minute and only the minute test piece is locally cooled. Otherwise, a test piece installing part which has a structure capable of attenuating thermal drift is used."

CITATION LIST

Patent Literatures

PTL 1: Japanese Patent Application Laid-Open No. 2010-257617

PTL 2: Japanese Patent Application Laid-Open No. 2000-277045

PTL 3: Japanese Patent Application Laid-Open No. 2007-53048

SUMMARY OF INVENTION

Technical Problem

The present inventors have made a keen examination on bringing a cooling temperature of the anti-contamination trap close to a coolant temperature and have come to gain the following knowledge.

In conventional structures, a space in a dual cooling tank is vacuum insulated, and a cooling part is cooled through a highly thermally conductive material connected to an inner container.

In the above-described structures, affected by heat infiltrating into the highly thermally conductive material and the cooling part, for example, in a case where liquid nitrogen is used as a coolant, it takes approximately 30 minutes for the temperature to reach −120° C. Even in a case where a significant amount of time has been spent, the temperature only reaches approximately −150° C., falling significantly short of the temperature of liquid nitrogen, namely −196° C.

In a case where a sample is observed being cooled by using a cooling mechanism such as a cooling holder capable of freezing and cooling the sample, when a temperature is approximately −150° C. at an end of the anti-contamination trap, since a temperature difference between the cooled sample and the end of the anti-contamination trap is small, frost is formed on a surface of the sample. The frost may hinder observation of the sample.

Solution to Problem

In order to resolve the above-described problem, for example, configurations described in CLAIMS are employed.

The present application includes more than one solution to the above-described problem. One exemplary solution is "a structure in which a device-internal cooling part is cooled by a vacuum application device, the structure including a cooling tank filled with a coolant for cooling the cooling part as well as a cooling pipe extending from the cooling tank to the vicinity of the cooling part, and the coolant being supplied to an end of the cooling part."

Contents described in the specifications and/or the drawings of Japanese Patent No. 2013-194807, which serves as the basis of priority claim of the present application, and Japanese Patent No. 2014-026042, for which Japanese Patent No. 2013-194807 also serves as the basis, are incorporated herein.

Advantageous Effects of Invention

According to the present invention, it is possible to rapidly cool a device-internal cooling part using a coolant (e.g. liquid nitrogen, dry ice, liquid helium, etc.) by a vacuum application device, and bring an attainment temperature close to the coolant temperature.

DESCRIPTION OF EMBODIMENTS

Figure 1:
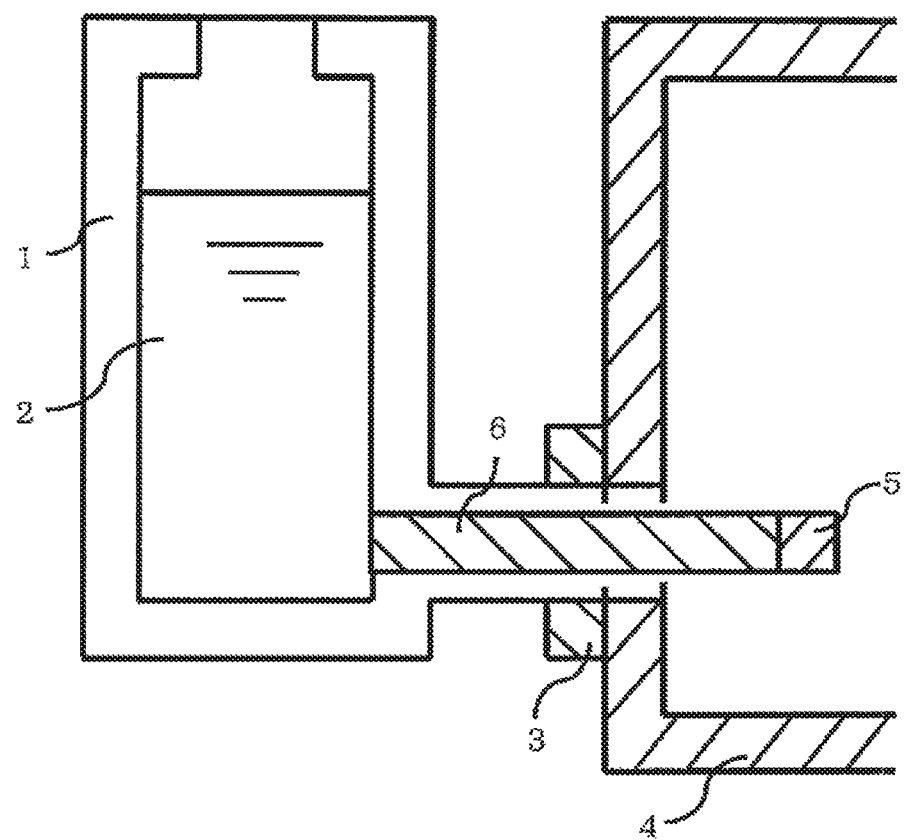
FIG. 1 is an explanatory drawing illustrating an anti-contamination trap having a conventional structure.

In an example, there is disclosed an anti-contamination trap having a cooling part arranged inside a vacuum sample chamber of a vacuum application device. The anti-contamination trap includes an introduction pipe that supplies a coolant to inside of the cooling part, and a discharge pipe that discharges a vaporized coolant inside the cooling part.

In the example, there is also disclosed a vacuum application device provided with an anti-contamination trap, a cooling part of the anti-contamination trap being arranged inside a vacuum sample chamber thereof. The vacuum application device includes an introduction pipe that supplies a coolant to inside of the cooling part, and a discharge pipe that discharges a vaporized coolant inside the cooling part.

Furthermore, in the example, it is disclosed that the discharge pipe is inserted inside the introduction pipe.

Furthermore, in the example, it is disclosed that there is provided an adjustment portion that adjusts a position of the introduction pipe.

Furthermore, in the example, it is disclosed that the cooling part is constituted of a material having a thermal conductivity higher than that of the introduction pipe.

Furthermore, in the example, it is disclosed that the cooling part is constituted of oxygen free copper or aluminum.

Furthermore, in the example, it is disclosed that the cooling part has a hemispherical shape, a U-shape with a recessed center portion, a shape having upper and lower plate-shape portions, or a shape having a lower plate-shape portion.

Furthermore, in the example, it is disclosed that the coolant is liquid nitrogen.

Furthermore, in the example, it is disclosed that a cooling tank is provided with an inner cooling tank that holds the coolant and an outer cooling tank that houses the inner cooling tank interposing a heat shielding portion. The heat shielding portion and the vacuum sample chamber are configured to be spatially connected.

Furthermore, in the example, it is disclosed that the vacuum application device includes a cooling holder that cools a sample with a coolant, which is of the same type as the coolant of the anti-contamination trap.

Furthermore, in the example, it is disclosed that the vacuum application device is a charged particle beam device in which the sample is disposed between an upper magnetic pole and an outer magnetic pole of an objective lens.

Furthermore, in the example, it is disclosed that the vacuum application device is a transmission electron microscope allowing an electron beam to transmit though a thin film sample.

Furthermore, in the example, it is disclosed that the anti-contamination trap prevents contamination of the sample by cooling a device-internal cooling part by the vacuum application device. The anti-contamination trap includes a cooling pipe extending from the cooling tank filled with the coolant for cooling the cooling part to the cooling part, and the coolant is supplied from the cooling tank to an end of the cooling part.

Furthermore, in the example, it is disclosed that a material having high thermal conductivity such as the oxygen free copper or the aluminum is used in the cooling part and the cooling pipe.

Furthermore, in the example, it is disclosed that a tube for discharging air bubbles inside the cooling pipe is inserted into the cooling part from the cooling tank.

Furthermore, in the example, it is disclosed that the cooling pipe has a gradient so as to become lower toward the cooling part from the cooling tank.

Furthermore, it is disclosed that the cooling pipe is constituted of two small-diameter cooling pipes vertically arranged between the cooling tank and the cooling part.

Hereinafter, an example of the present invention is described with reference to the drawings. Note that the drawings are used exclusively to make the present invention understandable and are not intended to diminish a scope of rights.

Examples

FIG. 1 is an anti-contamination trap having a conventional structure.

The anti-contamination trap having the conventional structure includes: a cooling tank 1 filled with a coolant 2; a flange 3 connecting a vacuum chamber 4 to the cooling tank 1; an oxygen free copper bar 6 connected to the cooling tank 1; and a cooling part 5. The cooling tank 1 has a structure in which inside of a dual wall is vacuum. When the coolant 2 is put into the cooling tank 1, the cooling part 5 is cooled through the oxygen free copper bar 6 connected to the cooling tank 1.

In the above-described structure, affected by heat infiltrating into the oxygen free copper bar 6 and the cooling part 5, it takes approximately 30 minutes for the temperature to reach −120° C. Even in a case where a significant amount of time has been spent, the temperature only reaches approximately −150° C., falling significantly short of the temperature of liquid nitrogen, namely −196° C.

Figure 2:
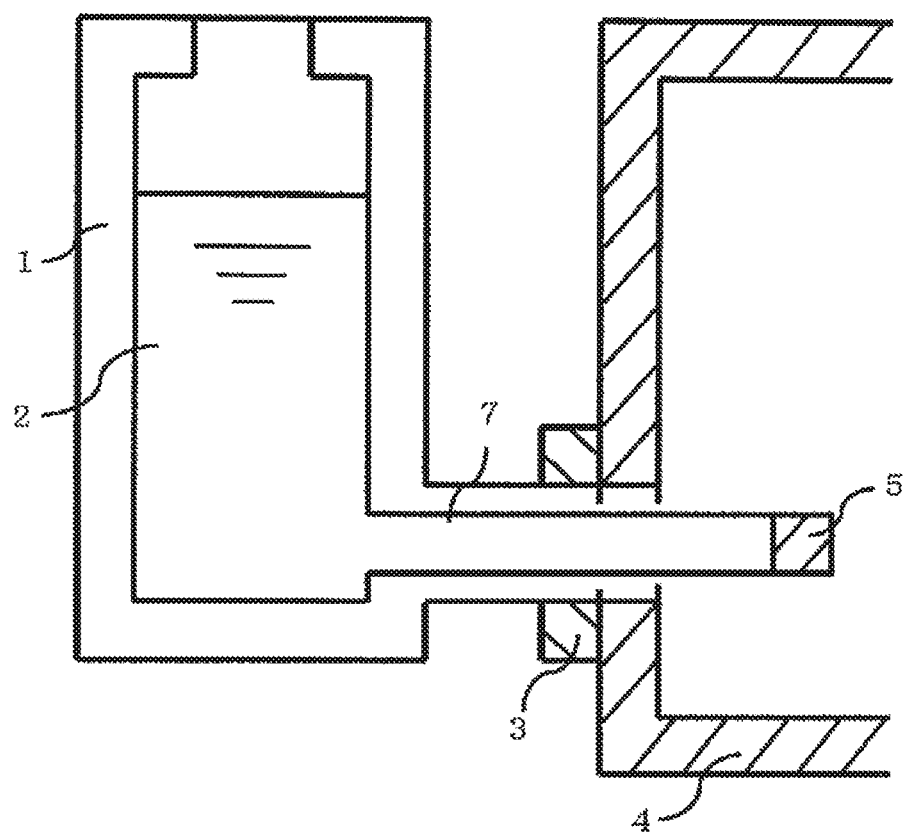
FIG. 2 is an explanatory drawing illustrating an anti-contamination trap having a pipe structure.

FIG. 2 is an exemplary structure for resolving the above-described problem of a heat loss and a reduction of cooling time.

In this case, an anti-contamination trap includes: the cooling tank 1 filled with the coolant 2; the flange 3 connecting the vacuum chamber 4 to the cooling tank 1; a cooling pipe 7 connected to the cooling tank 1; and the cooling part 5. When the coolant 2 is put into the cooling tank 1, the coolant 2 fills the cooling pipe 7, whereby the cooling part 5 is cooled.

However, in a case where liquid nitrogen, for example, is used as the coolant 2, when a diameter of the cooling pipe 7 extending from the cooling tank 1 to the cooling part 5 is small, the nitrogen vaporized at an end portion of the cooling pipe 7 turns into air bubbles and becomes hard to be discharged. Accordingly, the liquid nitrogen does not reach the end portion of the cooling pipe 7, whereby a temperature of the cooling part 5 is increased.

Figure 3:
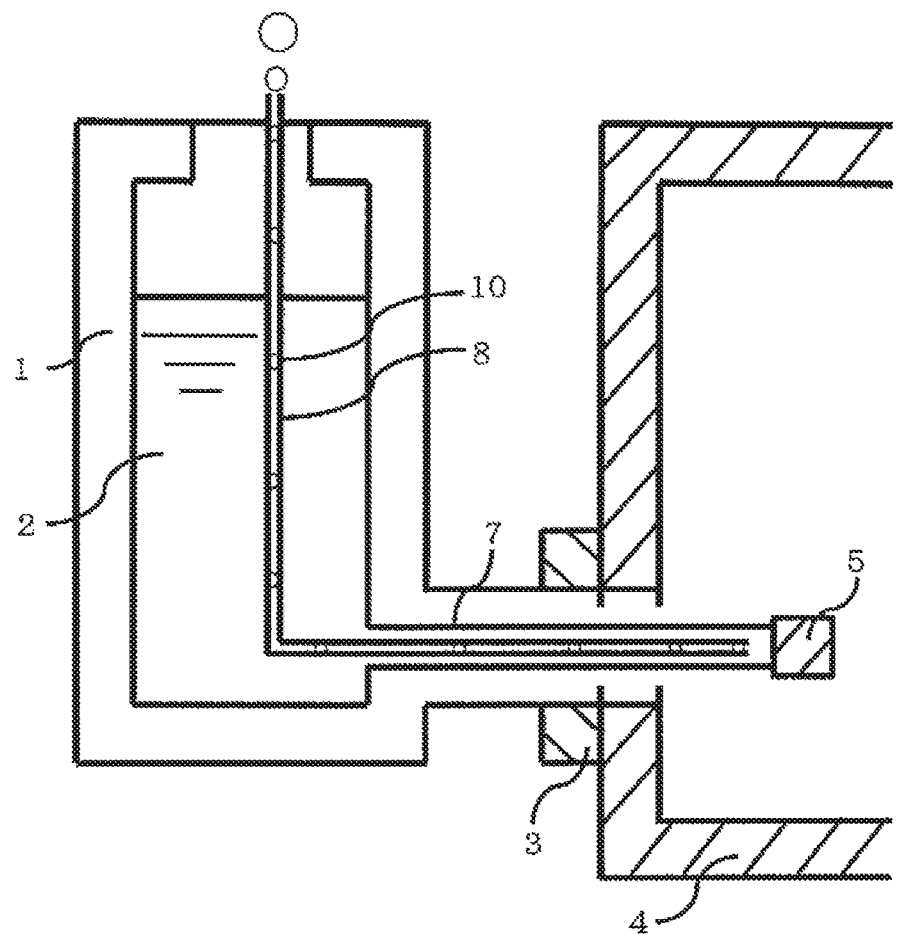
FIG. 3 is an explanatory drawing illustrating a specific example for exhausting nitrogen vaporized inside a cooling pipe.

FIG. 3 is a specific example of a method of resolving a state in which the vaporized nitrogen turns into the air bubbles and becomes hard to be discharged.

In this case, the anti-contamination trap includes: the cooling tank 1 filled with the coolant 2; the flange 3 connecting the vacuum chamber 4 to the cooling tank 1; the cooling pipe 7 connected to the cooling tank 1; the cooling part 5; and a vaporized nitrogen discharge tube 8 that discharges the nitrogen vaporized at the end portion of the cooling pipe 7.

By inserting the vaporized nitrogen discharge tube 8 into the end portion of the cooling pipe 7, air bubbles 10 of the nitrogen vaporized at the end portion of the cooling pipe 7 are discharged through the vaporized nitrogen discharge tube 8. By the air bubbles 10 of the vaporized nitrogen being discharged through the vaporized nitrogen discharge tube 8, the liquid nitrogen fills the cooling pipe 7 up to the end portion thereof.

In this example, since the liquid nitrogen is introduced to the vicinity of the cooling part 5, it is possible to cool the cooling part 5 up to −186° C. in approximately three minutes.

Figure 8:
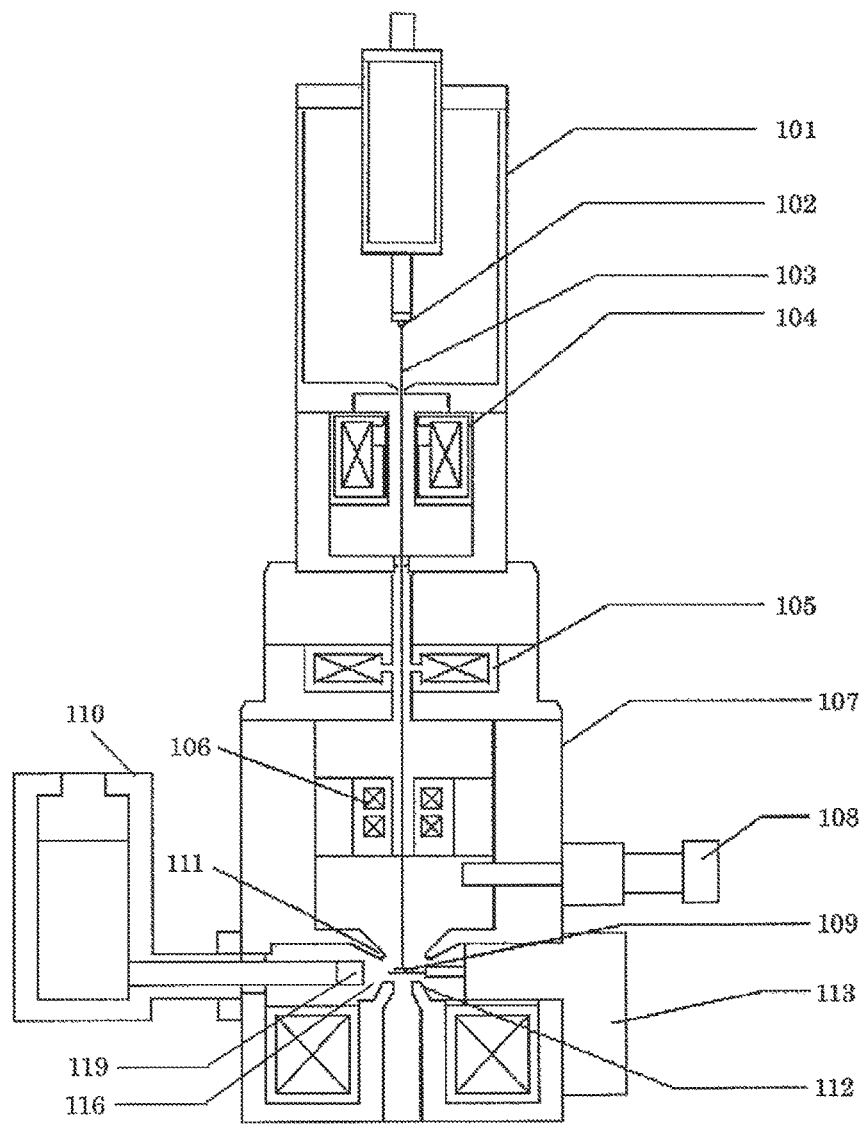
FIG. 8 is a configuration diagram of a scanning electron microscope installed with the anti-contamination trap of FIG. 3.

FIG. 8 is a configuration diagram of a scanning electron microscope installed with the anti-contamination trap in FIG. 3.

A scanning electron microscope 101 includes: an electron optical lens barrel 107 that radiates an electron beam 103; a control device that adjusts each condition of the electron optical lens barrel 107; a secondary electron detector 108 that detects a secondary electron emitted from a sample due to irradiation of the sample with the electron beam 103; a sample holder 109 capable of freezing and cooling the sample; an anti-contamination trap 110 according to FIG. 3, and the like. Note that it is also possible to arrange a transmission electron detector capable of detecting an electron that has transmitted through the sample below the sample. Inside the scanning electron optical lens barrel 107, there is provided: an electron source 102; a first condenser lens 104 and a second condenser lens 105 that converge the electron beam 103 emitted from the electron source 102; a deflection coil 106 that scans with the electron beam 103; and an objective lens that focuses the electron beam 103. The objective lens is constituted of an upper magnetic pole 111 and a lower magnetic pole 112. Furthermore, a sample stage 113 is provided on a side surface of the electron optical lens barrel 107. The sample holder 109 holding the sample is arranged between the upper magnetic pole 111 and the lower magnetic pole 112 of the objective lens. The anti-contamination trap 110 is provided on another side surface of the electron optical lens barrel 107 where the sample stage 113, which moves an end portion of the sample holder 109 in a desired direction. A cooling part 119 at an end of the anti-contamination trap 110 is positioned in the vicinity of the sample between the upper magnetic pole 111 and the lower magnetic pole 112 of the objective lens in a vacuum chamber 116.

Figure 9:
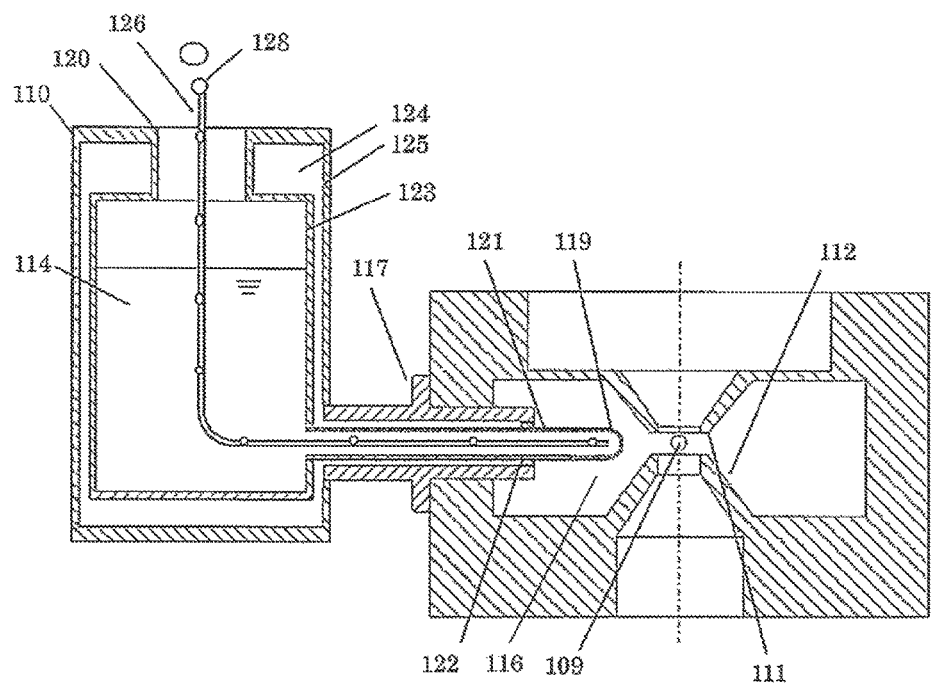
FIG. 9 is a partially enlarged view of the scanning electron microscope installed with the anti-contamination trap of FIG. 3.

FIG. 9 is a partially enlarged view of the scanning electron microscope installed with the anti-contamination trap according to FIG. 3.

The anti-contamination trap 110 includes: a cooling tank (an inner cooling tank 123 and an outer cooling tank 125); a cooling tank inlet 120 through which a coolant 114 is put in the cooling tank; a flange 117 connecting the vacuum chamber 116 to the cooling tank; a cooling pipe 121 connected to the cooling tank; a cooling pipe adjustment portion 122 for adjusting a position of the cooling pipe 121; and the cooling part 119.

The cooling tank has a dual structure constituted of the inner cooling tank 123 that holds the coolant, and the outer cooling tank 125 that houses the inner cooling tank 123 interposing a heat shielding portion 124. The heat shielding portion 124 and the vacuum chamber 116 constitute a connected space. It is structured such that, by vacuum evacuating the vacuum chamber, a vacuum state is formed in the heat shielding portion 124 as well.

The cooling pipe adjustment portion 122 is configured such that, for example, a plurality of screws, which is fastened to a plurality of screw holes at an end portion of the flange 117, holds the cooling pipe 121 inside the flange 117 through a collar. By adjusting the plurality of screws, it is possible to adjust the position of the cooling pipe 121. Since the inner cooling tank 123 and the cooling pipe 121 are welded together, positional misalignment may be caused to the cooling pipe 121 due to welding distortion; however, by using the cooling pipe adjustment portion 122, it is possible to dispose the cooling part 119 to an appropriate position not interfering with the upper magnetic pole 111 and the lower magnetic pole 112.

The cooling pipe 121 is constituted of SUS and the like; however, a highly thermally conductive material such as oxygen free copper and aluminum is used in the cooling part 119 at an end thereof. The cooling part 119 has a hemispherical shape and a fixed thickness. The cooling part 119 has a smaller heat capacitance per surface area than that of the cooling pipe 121, whereby it may be cooled in a shorter period of time when the coolant 114 is provided.

A vaporized nitrogen discharge tube 126 is inserted up to the cooling part 119. In a case where a material of the vaporized nitrogen discharge tube 126 is resin, it may be easy to be inserted from the cooling tank inlet 120 up to the cooling part 119; however, it is also possible to use a metal pipe as the tube, which is to be welded inside the cooling pipe.

Since the vaporized nitrogen discharge tube 126 is inserted up to the cooling part 119, air bubbles 128 of nitrogen vaporized in the cooling part 119 are discharged through the vaporized nitrogen discharge tube 126. Accordingly, when the coolant 114 is supplied to the inner cooling tank 123 through the cooling tank inlet 120, the coolant 114 fills the cooling part 119 through the cooling pipe 121, whereby the cooling part 119 is cooled.

In this example, since the coolant 114 exists inside the cooling part 119, which is constituted of the highly thermally conductive material, the cooling part 119 is cooled to a temperature close to a coolant temperature. In a case where the cooling holder or the like capable of freezing and cooling the sample is cooled by using the same coolant, due to a simple structure thereof, the cooling part 119 according to this example may be cooled to a still lower temperature by the cooling holder or the like. Thus, it is possible to increase a temperature difference between the sample, which is cooled by the cooling holder or the like, and the anti-contamination trap 110, whereby it is possible to prevent forming of frost on a surface of the sample.

In particular, by cooling the sample by using the cooling holder or the like in an in-lens SEM in which the sample is disposed between an upper magnetic pole and a lower magnetic pole as well as in a transmission electron microscope that transmits the electron beam through the thin film sample, the temperature of the sample tends to be low since volume of the sample is small. Even in such case, it is possible to prevent forming of the frost on the surface of the sample since the temperature difference with the anti-contamination trap is large.

Figure 4:
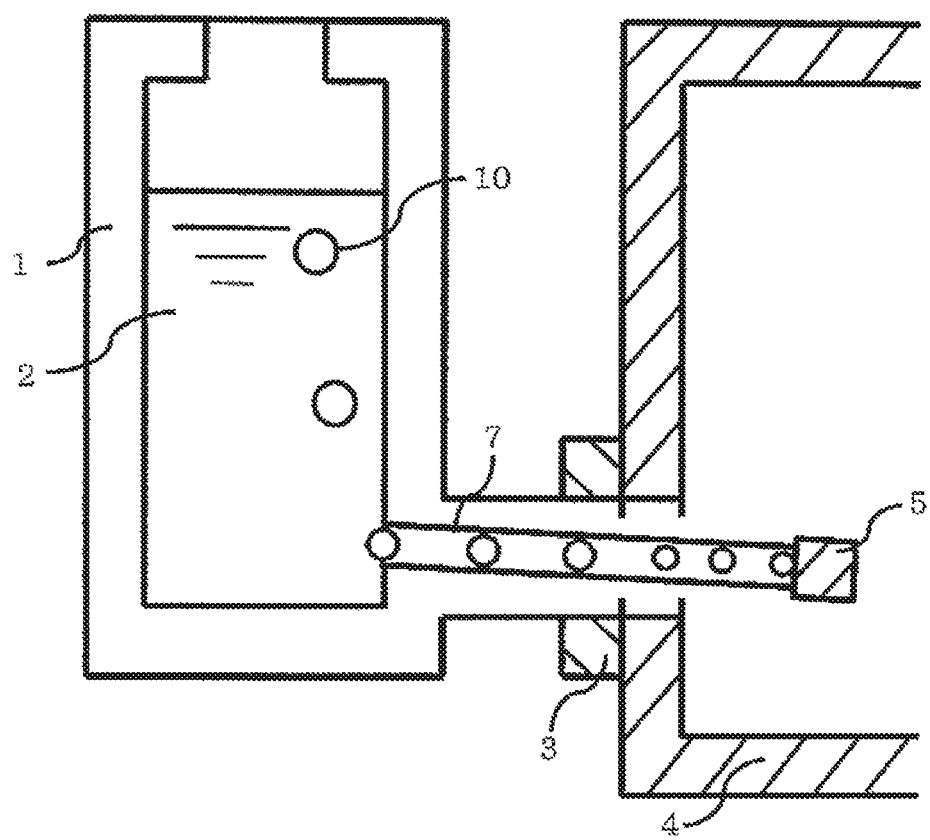
FIG. 4 is an explanatory drawing illustrating a specific example for exhausting the nitrogen vaporized inside the cooling pipe.

A structure illustrated in FIG. 4 may also be used as a specific example of the method of resolving the state in which the vaporized nitrogen turns into the air bubbles and becomes hard to be discharged in addition to the structure illustrated in FIG. 3.

In this case, the anti-contamination trap includes: the cooling tank 1 filled with the coolant 2; the flange 3 connecting the vacuum chamber 4 to the cooling tank 1; the cooling pipe 7 having a gradient and being connected to the cooling tank 1; and the cooling part 5.

In FIG. 3, by inserting the vaporized nitrogen discharge tube 8 up to the end portion of the cooling pipe 7, the air bubbles 10 of the nitrogen vaporized at the end portion of the cooling pipe 7 are discharged through the vaporized nitrogen discharge tube 8. In this specific example, as illustrated in FIG. 4, by using a structure in which the cooling pipe 7 has the gradient, the air bubbles 10 of the vaporized nitrogen become easily discharged. Thus, the liquid nitrogen fills the cooling pipe 7 up to the end portion thereof. Since the liquid nitrogen is introduced up to the vicinity of the cooling part 5, it is possible to cool the cooling part 5 to a temperature close to the coolant temperature in a short period of time.

Figure 5:
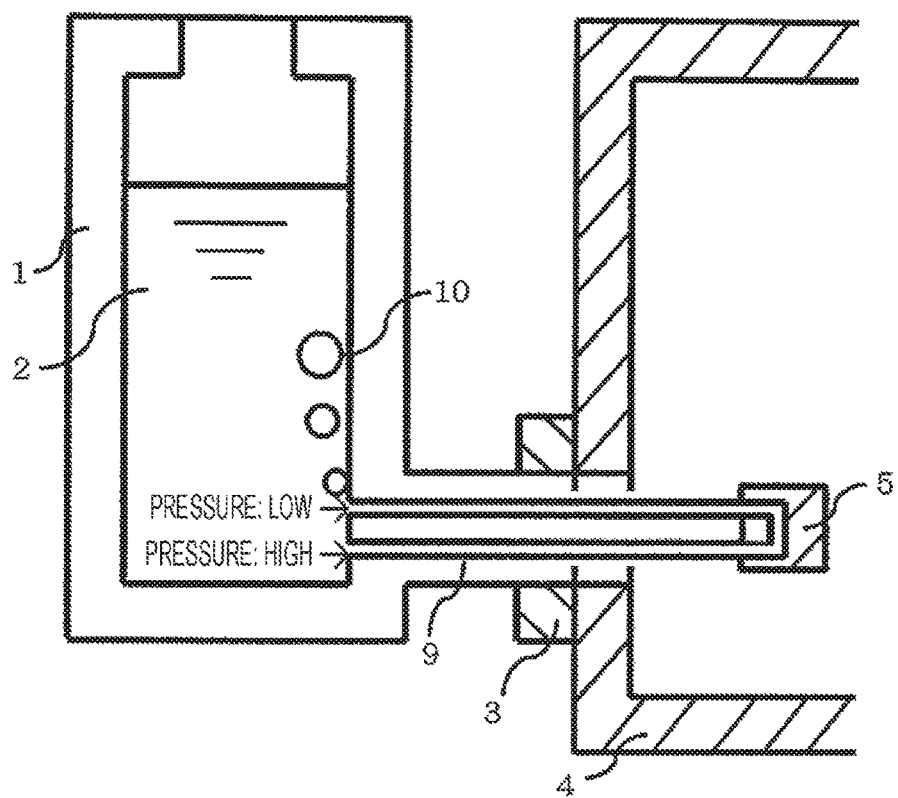
FIG. 5 is an explanatory drawing illustrating a specific example for exhausting the nitrogen vaporized inside the cooling pipe.

A structure illustrated in FIG. 5 may also be used as a specific example of the method of resolving the state in which the vaporized nitrogen turns into the air bubbles 10 and becomes hard to be discharged in addition to the structures illustrated in FIGS. 3 and 4.

In this case, the anti-contamination trap includes: the cooling tank 1 filled with the coolant 2; the flange 3 connecting the vacuum chamber 4 to the cooling tank 1; a small-diameter cooling pipe 9 connected to the cooling tank 1; and the cooling part 5.

As a structure for discharging the air bubbles 10 of the nitrogen vaporized at the end portion of the cooling pipe 7 other than the structures in FIGS. 3 and 4, by vertically arranging the small-diameter cooling pipe 9 as illustrated in FIG. 5, it is possible to discharge the air bubbles 10 of the vaporized nitrogen inside the small-diameter cooling pipe 9 from an upper pipe using a pressure difference of the liquid nitrogen. Thus, the liquid nitrogen fills the small-diameter cooling pipe 9 up to an end portion thereof. Since the liquid nitrogen is introduced up to the vicinity of the cooling part 5, it is possible to cool the cooling part 5 to a temperature close to the coolant temperature in a short period of time.

Figure 10:
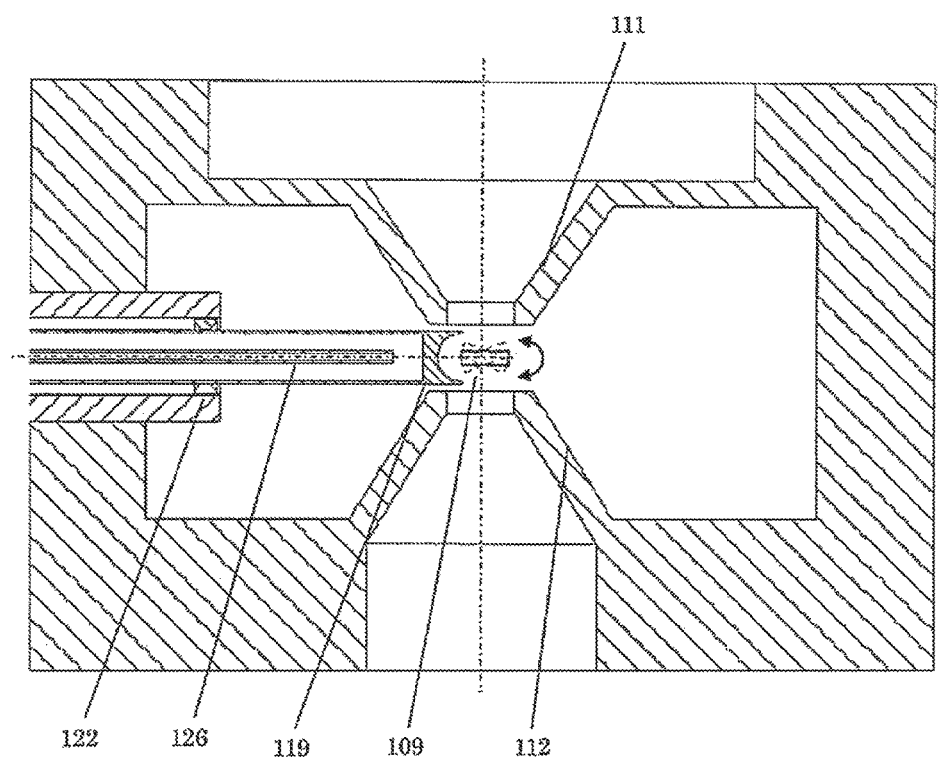
FIG. 10 is an explanatory drawing illustrating a first modification of the cooling part.

FIG. 10 is an explanatory drawing illustrating a first modification of the cooling part. The cooling part 119 has a U-shape with a recessed center portion, and the tiltable sample holder 109 is arranged to the recessed portion of the cooling part 119. Since a change of a distance with the cooling part 119 is small even when the sample holder 109 is tilted, it is possible to prevent forming of the frost on the surface of the sample by tilting the sample holder 109.

Figure 11:
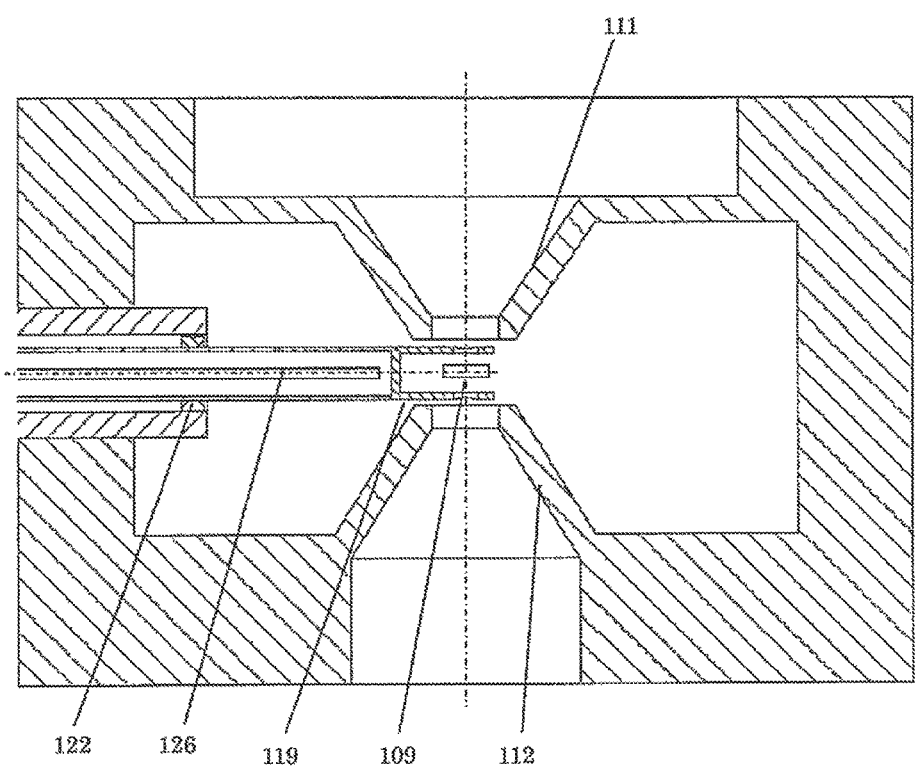
FIG. 11 is an explanatory drawing illustrating a second modification of the cooling part.

FIG. 11 is an explanatory drawing illustrating a second modification of the cooling part. The cooling part 119 has a shape having upper and lower plate-shape portions, and the plate-shape portions extend to a region irradiated with the electron beam 103. Since an opening is formed in each of the upper and lower plate-shape portions, the electron beam and the like are not blocked. The sample holder 109 is arranged so as to be sandwiched by the upper and lower plate-shape portions. Since both of upper and lower surfaces of the sample holder 109 are covered with the cooling part 119, it is possible to strongly prevent forming of the frost on an entire surface of the sample.

Figure 12:
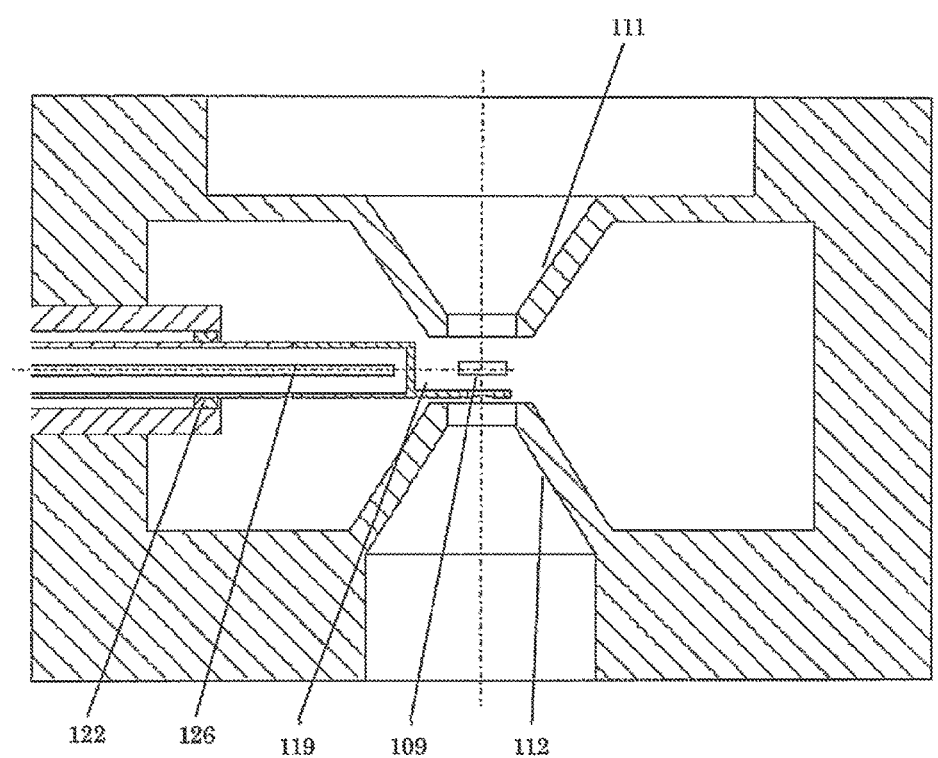
FIG. 12 is an explanatory drawing illustrating a third modification of the cooling part.

FIG. 12 is an explanatory drawing illustrating a third modification of the cooling part. The cooling part 119 has a shape having a lower plate-shape portion, and the plate-shape portion extends to a region irradiated with the electron beam 103. Since an opening is formed in the lower plate-shape portion, an electron that has transmitted through the sample and the like are not blocked. The sample holder 109 is arranged above the plate-shape portion. Since a surface on an opposite side of a surface irradiated with the electron beam where frost is easily formed is covered with the cooling part, it is possible to efficiently prevent forming of the frost on the surface of the sample.

Figure 6:
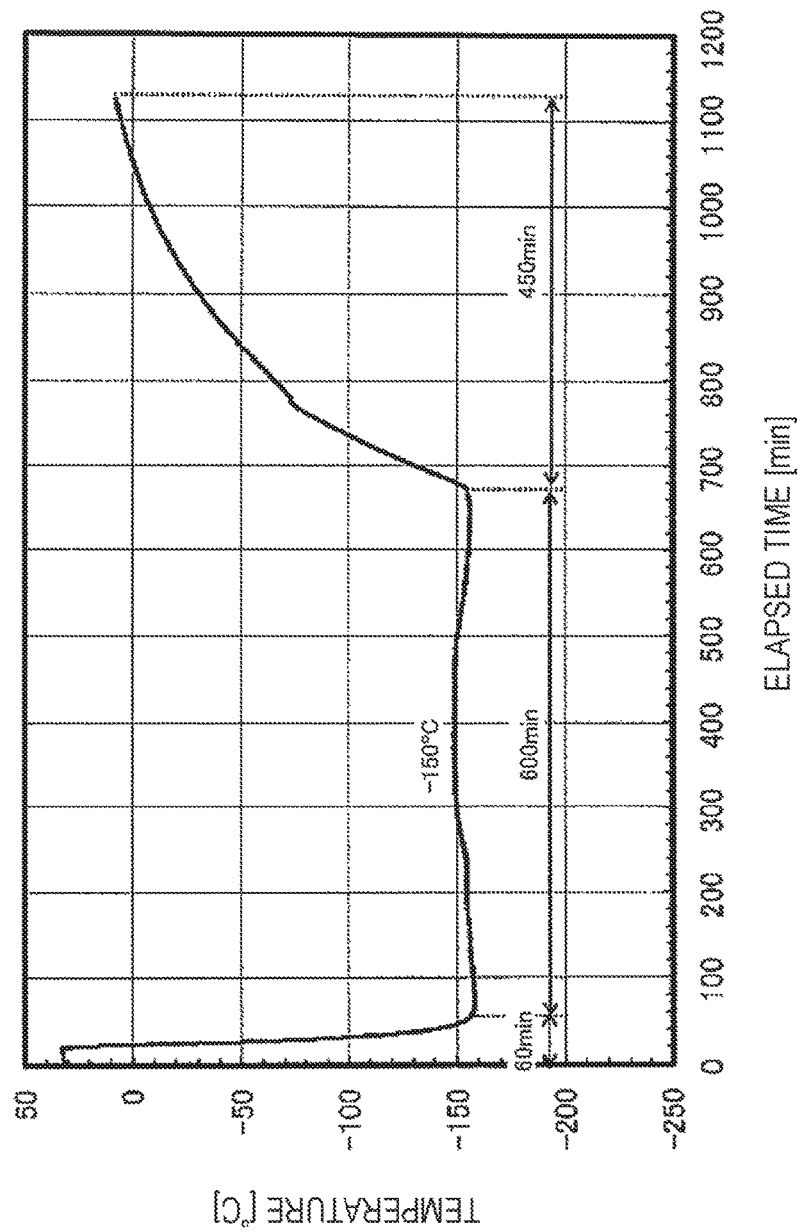
FIG. 6 is temperature measurement data of the anti-contamination trap having the conventional structure.

FIG. 6 is a result of a temperature measurement of an end of the cooling part 5 having the conventional structure illustrated in FIG. 1. In the temperature measurement, the liquid nitrogen is used as the coolant 2, and a K thermocouple is installed to the end of the cooling part 5. It takes approximately 60 minutes for a temperature at the end of the cooling part 5 to reach −150° C. In this case, until the temperature at the end of the cooling part 5 becomes stable at a low temperature, image observation is not possible due to vibration of bubbling caused by air bubbles actively generated from the coolant and the like.

Figure 7:
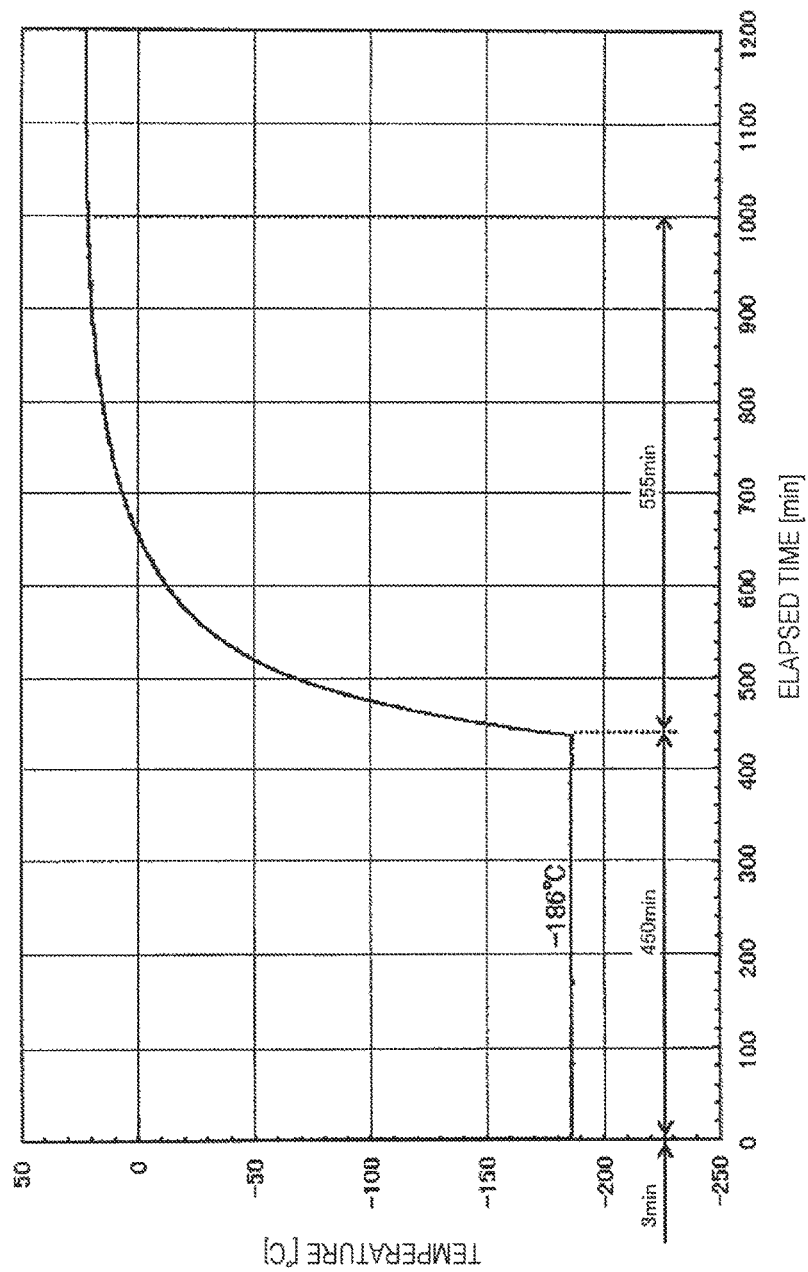
FIG. 7 is temperature measurement data of the anti-contamination trap having the pipe structure.

FIG. 7 is a result of a temperature measurement of an end of the cooling part 5 having a structure illustrated in FIG. 3. In the temperature measurement, the liquid nitrogen is used as the coolant 2, and the K thermocouple is installed to the end of the cooling part 5. It takes approximately three minutes for a temperature at the end of the cooling part 5 to reach −186° C., whereby rapid cooling is achieved. The vibration of the bubbling is quickly tranquilized, whereby the image observation is possible immediately.

Note that the present invention is not to be limited to the above-described example and may include various modifications. For example, the above-described example is elaborated in detail to describe the present invention in an understandable manner, whereby it is not necessarily limited to one including all of the configurations that have been described. The present invention may also be carried out by using an out-lens SEM in which the objective lens only has an upper magnetic pole as well as a TEM that does not scan with an electron beam.

REFERENCE SIGNS LIST 1 cooling tank
2 coolant
3 flange
4 vacuum chamber
5 cooling part
6 oxygen free copper bar
7 cooling pipe
8 vaporized nitrogen discharge tube
9 small-diameter cooling pipe
10 air bubbles
101 scanning electron microscope (SEM)
102 electron source
103 electron beam
104 first condenser lens
105 second condenser lens
106 deflection coil
107 electron optical lens barrel
108 secondary electron detector
109 sample holder
110 anti-contamination trap
111 upper magnetic pole
112 lower magnetic pole
113 sample stage
114 coolant
115 cooling tank
116 vacuum chamber
117 flange
119 cooling part
120 cooling tank inlet
121 cooling pipe
122 cooling pipe adjustment portion
123 inner cooling tank
124 heat shielding portion
125 outer cooling tank
126 vaporized nitrogen discharge tube
128 air bubbles All publications, patents, and patent applications cited herein are to be directly incorporated by reference herein.

The invention claimed is:

1. An anti-contamination trap having a cooling part arranged inside a vacuum sample chamber of a vacuum application device, the anti-contamination trap comprising:
    an introduction pipe configured to supply a coolant to inside of the cooling part;
    a discharge pipe configured to discharge a vaporized coolant inside the cooling part; and
    an adjustment portion configured to adjust a position of the introduction pipe.

2. The anti-contamination trap according to claim 1, wherein
    the discharge pipe is inserted inside the introduction pipe.

3. The anti-contamination trap according to claim 1, wherein
    the cooling part is constituted of a material having thermal conductivity higher than that of the introduction pipe.

4. The anti-contamination trap according to claim 1, wherein
    the cooling part is constituted of oxygen free copper or aluminum.

5. The anti-contamination trap according to claim 1, wherein
    the cooling part has a hemispherical shape, a U-shape with a recessed center portion, a shape having upper and lower plate-shape portions, or a shape having a lower plate-shape portion.

6. The anti-contamination trap according to claim 1, wherein
    the coolant is liquid nitrogen.

7. The anti-contamination trap according to claim 1, comprising:
    an inner cooling tank configured to hold the coolant; and
    an outer cooling tank configured to house the inner cooling tank interposing a heat shielding portion, wherein
    the heat shielding portion is connected to the vacuum sample chamber such that a vacuum state is formed in the heat shielding portion when the vacuum sample chamber is evacuated.

8. A vacuum application device provided with an anti-contamination trap, a cooling part of the anti-contamination trap being arranged inside a vacuum sample chamber of the vacuum application device, the vacuum application device comprising:
    an introduction pipe configured to supply a coolant to inside of the cooling part;
    a discharge pipe configured to discharge a vaporized coolant inside the cooling part; and
    an adjustment portion configured to adjust a position of the introduction pipe.

9. The vacuum application device according to claim 8, wherein
    the discharge pipe is inserted inside the introduction pipe.

10. The vacuum application device according to claim 8, comprising:
    an adjustment portion configured to adjust a position of the introduction pipe.

11. The vacuum application device according to claim 8, wherein
    the cooling part is constituted of a material having thermal conductivity higher than that of the introduction pipe.

12. The vacuum application device according to claim 8, wherein
    the cooling part is constituted of oxygen free copper or aluminum.

13. The vacuum application device according to claim 8, wherein
    the cooling part has a hemispherical shape, a U-shape with a recessed center portion, a shape having upper and lower plate-shape portions, or a shape having a lower plate-shape portion.

14. The vacuum application device according to claim 8, wherein
    the coolant is liquid nitrogen.

15. The vacuum application device according to claim 8, comprising:
    an inner cooling tank configured hold the coolant; and
    an outer cooling tank configured to house the inner cooling tank interposing a heat shielding portion, wherein
    the heat shielding portion is connected to the vacuum sample chamber such that a vacuum state is formed in the heat shielding portion when the vacuum sample chamber is evacuated.

16. The vacuum application device according to claim 8, comprising:
  a cooling holder configured to cool a sample with a coolant of the same type as the coolant.

17. The vacuum application device according to claim 8, wherein
  the vacuum application device is a charged particle beam device in which a sample is disposed between an upper magnetic pole and an outer magnetic pole of an objective lens.

18. The vacuum application device according to claim 8, wherein
  the vacuum application device is a transmission electron microscope allowing an electron beam to transmit through a thin film sample.

19. An anti-contamination trap configured to prevent contamination of a sample by cooling a device-internal cooling part by a vacuum application device, the anti-contamination trap comprising:
  a cooling pipe extending from a cooling tank filled with a coolant for cooling the cooling part to the cooling part; and
  an adjustment portion configured to adjust a position of the cooling pipe, wherein
  the coolant is supplied from the cooling tank to an end of the cooling part.

20. The anti-contamination trap according to claim 19, wherein
  a material having high thermal conductivity such as oxygen free copper or aluminum is used in the cooling part and the cooling pipe.

21. The anti-contamination trap according to claim 19, wherein
  a tube for discharging air bubbles inside the cooling pipe is inserted into the cooling part from the cooling tank.

22. The anti-contamination trap according to claim 19, wherein
  the cooling pipe has a gradient so as to become lower toward the cooling part from the cooling tank.

23. The anti-contamination trap according to claim 19, wherein
  the cooling pipe is constituted of two small-diameter cooling pipes vertically arranged between the cooling tank and the cooling part.

* * * * *